(12) United States Patent
Cho et al.

(10) Patent No.: US 6,794,233 B2
(45) Date of Patent: Sep. 21, 2004

(54) METHODS OF FABRICATING A MOSFET

(75) Inventors: Yongsoo Cho, Daejeon (KR); Seung-Ho Hahn, Gyeonggi-do (KR)

(73) Assignee: Dongbu Electronics Co., Ltd., Seoul (KR)

(*) Notice: Subject to any disclaimer, the term of this patent is extended or adjusted under 35 U.S.C. 154(b) by 0 days.

(21) Appl. No.: 10/627,418

(22) Filed: Jul. 25, 2003

(65) Prior Publication Data

US 2004/0029349 A1 Feb. 12, 2004

(30) Foreign Application Priority Data

Jul. 25, 2002 (KR) .............................. 10-2002-0043793

(51) Int. Cl.$^7$ .................. H01L 21/336; H01L 21/8234
(52) U.S. Cl. ....................................................... 438/197
(58) Field of Search .......................... 438/197, 249, 438/251, 257, 267, 289, 303, 305, 306, 307, 311, 608, 663, 680, 681

(56) References Cited

U.S. PATENT DOCUMENTS

| | | | | |
|---|---|---|---|---|
| 5,372,957 A | * | 12/1994 | Liang et al. | 438/302 |
| 5,672,525 A | * | 9/1997 | Pan | 438/505 |
| 5,726,477 A | | 3/1998 | Williams et al. | 257/402 |
| 5,792,699 A | | 8/1998 | Tsui | 438/290 |
| 5,920,774 A | | 7/1999 | Wu | 438/224 |
| 6,008,099 A | | 12/1999 | Sultan et al. | 438/305 |
| 6,091,118 A | * | 7/2000 | Duane | 257/386 |
| 6,153,520 A | | 11/2000 | Chen | 438/682 |
| 6,214,656 B1 | | 4/2001 | Liaw | 438/199 |
| 6,221,746 B1 | | 4/2001 | Huang et al. | 438/592 |
| 6,242,334 B1 | * | 6/2001 | Huang et al. | 438/595 |
| 6,323,094 B1 | | 11/2001 | Wu | 438/303 |

FOREIGN PATENT DOCUMENTS

| | | |
|---|---|---|
| KR | 1019990066930 | 12/1999 |
| KR | 1020000019690 | 4/2000 |
| KR | 1020000048326 | 8/2000 |

* cited by examiner

*Primary Examiner*—David Nhu
(74) *Attorney, Agent, or Firm*—Grossman & Flight, LLC

(57) ABSTRACT

A method of fabricating a MOSFET is disclosed. The disclosed MOSFET-fabricating method comprises the steps of forming a polysilicon gate electrode on a semiconductor substrate; forming a first doping layer on the entire area of the semiconductor substrate including the polysilicon gate electrode; implanting some dopant into the first doping layer by means of a high-tilt angle pocket ion implantation; forming LDD regions on the surface of the substrate at both sides of the polysilicon gate electrode by diffusing the dopant of the first doping layer into the semiconductor substrate at the same time as forming an insulating layer on the first doping layer; forming a spacer by etching the insulating layer and the first doping layer; forming a second doping layer on the semiconductor substrate and the polysilicon gate electrode with the spacer; and forming source and drain regions on the surface of the semiconductor substrate at both sides of the polysilicon gate electrode with the spacer by conducting a thermal treatment process so that the dopant of the second doping layer can be diffused into the semiconductor substrate.

10 Claims, 5 Drawing Sheets

Ion implantation and Thermal treatment

METHODS OF FABRICATING A MOSFET

TECHNICAL FIELD

The present disclosure pertains to methods of fabricating a semiconductor device and, more particularly, to methods of fabricating a metal-oxide-semiconductor field effect transistor (hereinafter referred to as "MOSFET") that is able to ensure an effective channel length.

BACKGROUND

Line width in semiconductor devices has been continuously reduced due to high integration of semiconductor devices. As the line width in a gate electrode shrinks, the length of the channel decreases. In addition, the threshold voltage starts to decrease appreciably with the channel length. This phenomenon is typically called the "short channel effect." Accordingly, various technologies to reduce such short channel effect have been proposed.

Preferably, the short channel effect is obviated for high integration of a semiconductor device. An example of a method for obviating the short channel effect is to form lightly doped drain (LDD) regions.

FIGS. 1a through 1d are cross-sectional views illustrating a process of fabricating a MOSFET with LDD regions. Referring to FIG. 1a, a gate oxide layer 2a and a polysilicon layer 2b as a conducting layer for a gate, are formed on a semiconductor substrate 1. The polysilicon layer 2b and gate oxide layer 2a are etched to form a polysilicon gate electrode 3. Then, as shown in FIG. 1b, a low-concentration ion implantation and a thermal treatment process are used to form LDD regions 6 on the surface of the substrate at both sides of the polysilicon gate electrode 3.

Next, referring to FIG. 1c, the whole area of the semiconductor substrate 1 including the polysilicon gate electrode 3 is covered with an insulating layer, and the insulating layer is blanket-etched to form a gate spacer 5 on both lateral walls of the polysilicon gate electrode 3. Then, as shown in FIG. 1d, a dopant is implanted into the substrate part at both sides of the polysilicon gate electrode 3 including the spacer 5 by means of high-concentration ion implantation. After the ion implantation, a thermal treatment process is conducted to form source and drain regions 8 having LDD regions 6.

However, in the above-described method of fabricating a MOSFET, it is difficult to ensure an effective channel length because the LDD regions and source and drain regions are formed by ion implantation and thermal treatment.

DETAILED DESCRIPTION

The present disclosure is directed to a method of fabricating a MOSFET that is able to ensure an effective channel length. The disclosed method includes (1) forming a polysilicon gate electrode on a semiconductor substrate; (2) forming a first doping layer on the whole area of the semiconductor substrate including the polysilicon gate electrode; (3) implanting some dopant into the first doping layer by means of a high-tilt angle pocket ion implantation; (4) forming LDD regions on the surface of the substrate at both sides of the polysilicon gate electrode by diffusing the dopant of the first doping layer into the semiconductor substrate at the same time as forming an insulating layer on the first doping layer; (5) forming a spacer by etching the insulating layer and the first doping layer; (6) forming a second doping layer on the semiconductor substrate and the polysilicon gate electrode with the spacer; and (7) forming source and drain regions on the surface of the semiconductor substrate at both sides of the polysilicon gate electrode with the spacer by conducting a thermal treatment process so that the dopant of the second doping layer can be diffused into the semiconductor substrate.

The first doping layer may be made of silicated glass with a dopant. For example, borosilicate glass (BSG) or phosphosilicate glass (PSG) may be used for the first doping layer. As a result, the LDD regions can be formed, without further thermal treatment, by diffusing the dopant of the first doping layer into the substrate when the subsequent insulating layer is formed. The second doping layer is an oxide layer and may be formed by means of a plasma enhanced chemical vapor deposition (PECVD) process. As a result, the source and drain regions can be formed by diffusing the dopant of the second doping layer into the substrate by means of a subsequent thermal treatment.

Figure 1A:
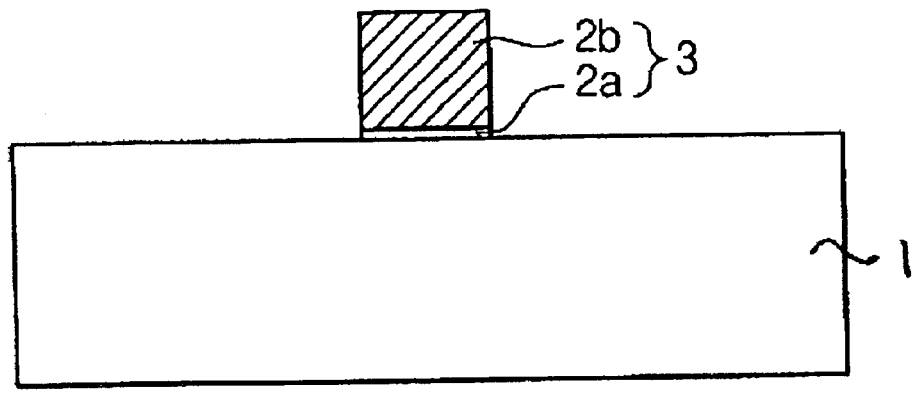
FIGS. 1a–1d are cross-sectional views illustrating one process of fabricating a MOSFET.
Figure 1B:
Figure 1B:
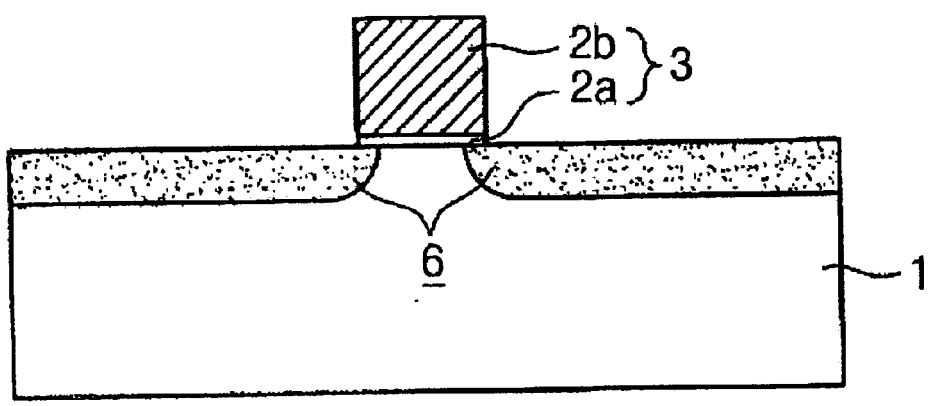
Figure 1C:
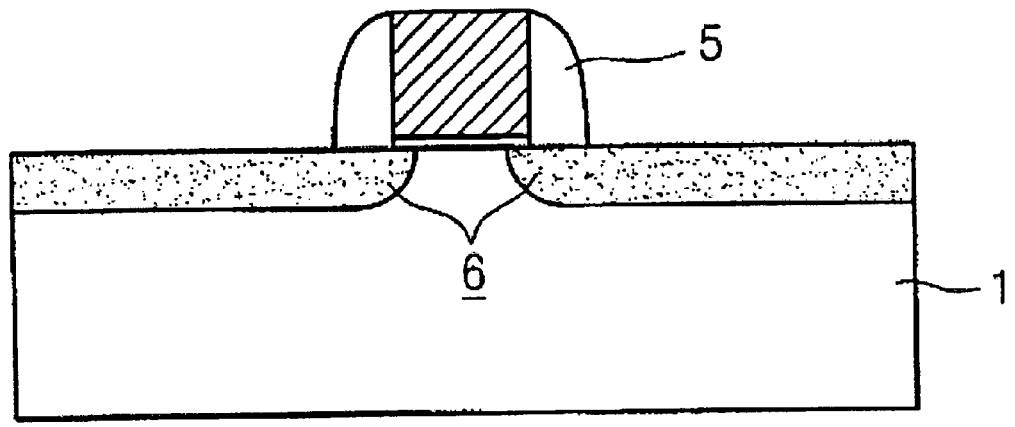
Figure 1D:
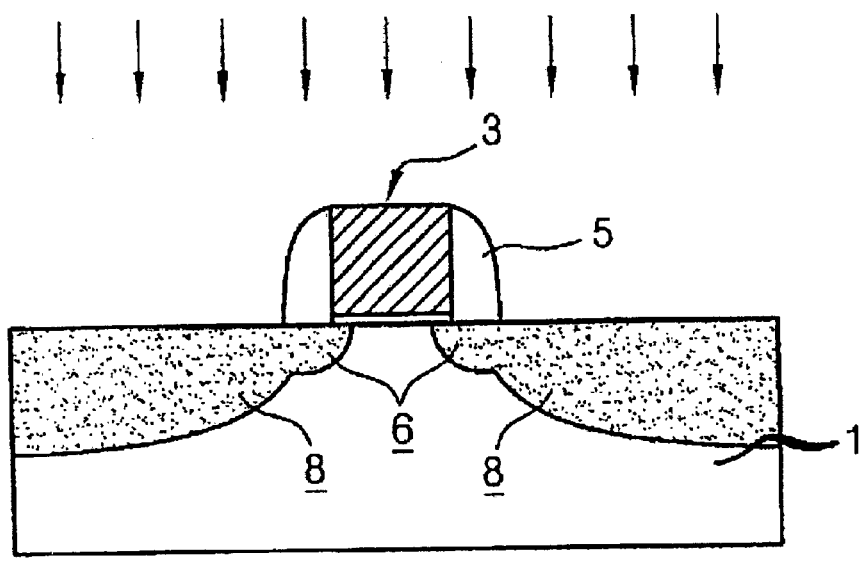
Figure 2A:
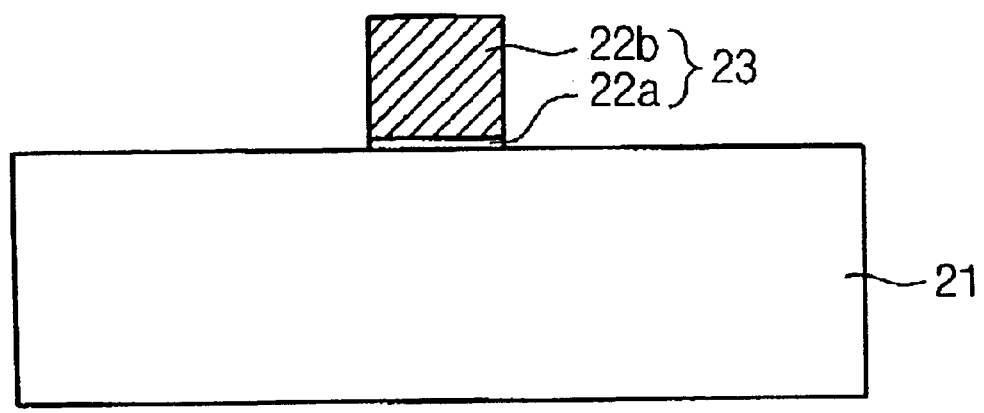
FIGS. 2a–2e are cross-sectional views illustrating another process of fabricating a MOSFET.

Referring to the example illustrated in FIG. 2a, a gate oxide layer 22a and a polysilicon layer 22b as a conducting layer for a gate, are formed on a semiconductor substrate 21. The semiconductor substrate may be, for example, Si, GaAs or silicon-on-insulator. Then, the polysilicon layer 22b and the gate oxide layer 22a are etched to form a polysilicon gate electrode 23.

Figure 2B:
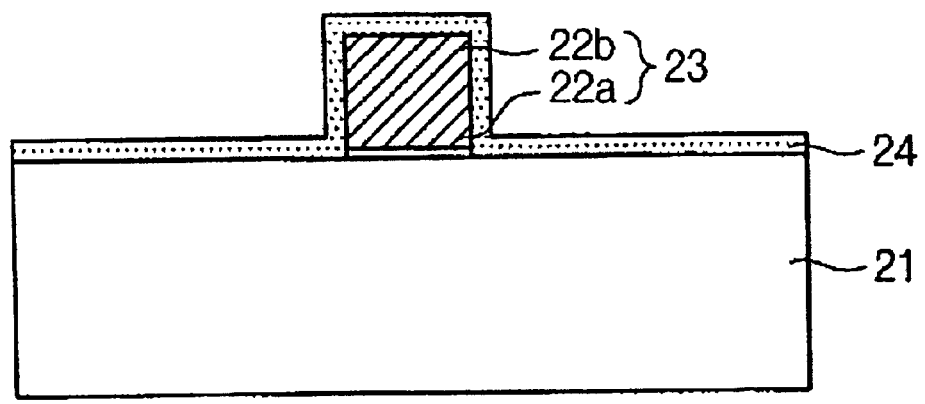

Referring to the example illustrated in FIG. 2b, a first doping layer 24 is coated on top of the whole area of the semiconductor substrate 21, including the polysilicon gate electrode 23. The first doping layer 24 may be made of, for example, BSG or PSG.

Figure 2C:
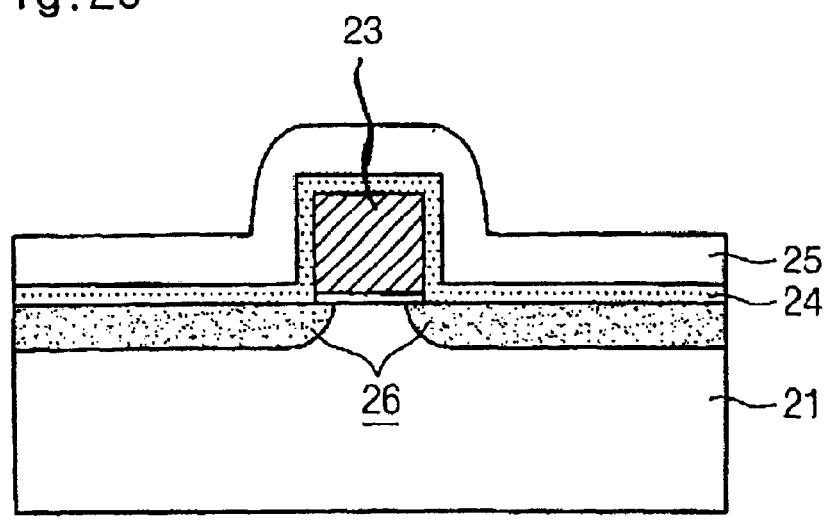

Referring to the example illustrated in FIG. 2c, a dopant is implanted into the first doping layer by means of a high-tilt angle pocket ion implantation. The pocket ion implantation may be performed with an angle between 5° and 45°. The dopant may be, for example, B, $BF_2$, P, As or N. Then, an insulating layer 25 is formed on the first doping layer 24. For example, a low pressure chemical vapor deposition (LPCVD) process may be used. The dopant which is doped into the first doping layer 24 is diffused into the semiconductor substrate 21 to form LDD regions 26 on the surface of the substrate at both sides of the polysilicon gate electrode 23.

Figure 2D:
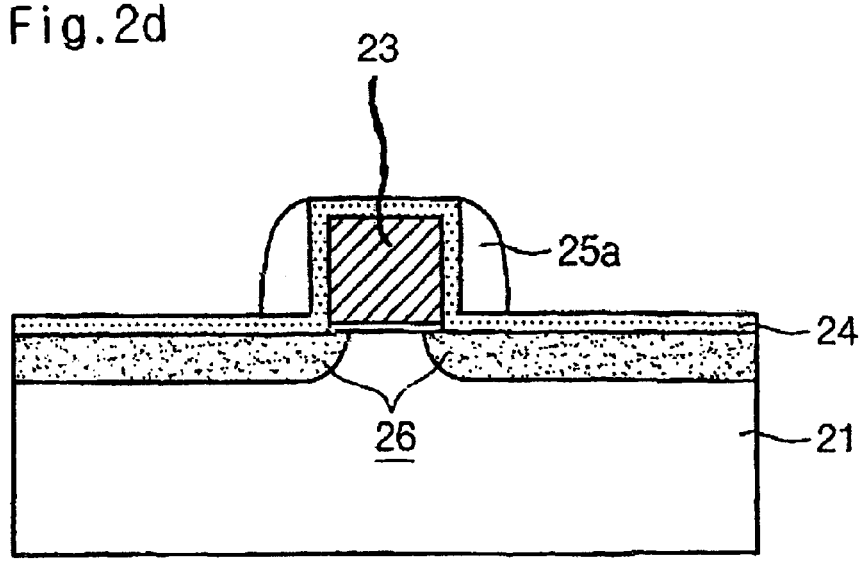

Referring to the example illustrated in FIG. 2d, the insulating layer 25 and the first doping layer 24 are etched to form a spacer 25a. As an example, the thickness of the spacer may be between 50 and 500 Å.

Figure 2E:
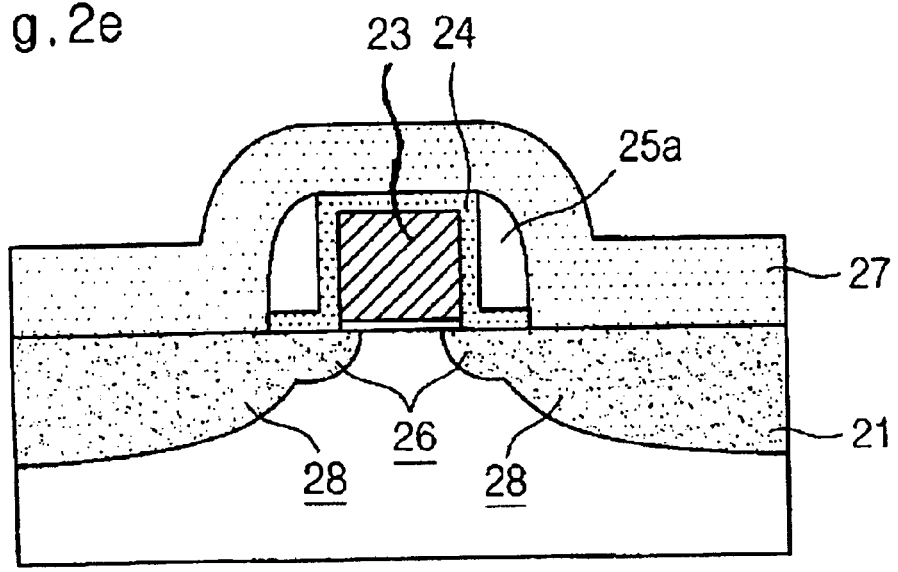

Next, referring to the example illustrated in FIG. 2e, the semiconductor substrate 21 and the polysilicon gate electrode 23 including the spacer 25a are covered with a second doping layer 27. The second doping layer 27 is an oxide layer that may be formed, for example, by means of a PECVD process. As an example, the thickness of the second doping layer may be between 100 and 1000 Å. Subsequently, a rapid thermal process is conducted to form source and drain regions 28 with shallow depths on the surface of the semiconductor substrate 21 at both sides of the polysilicon gate electrode 23 having the spacer 25a. As an example, the thermal treatment may be performed at a temperature between 950 and 1150° C. for 3 to 20 seconds.

In the method disclosed herein, LDD regions are formed by diffusing the dopant of the first doping layer into the semiconductor substrate. In addition, source and drain regions are formed by diffusing the dopant of the second doping layer. As a result, effective channel length is more ensured compared to methods which form LDD regions, source regions, and drain regions by means of an ion implantation and a thermal treatment.

Thus, the present method is useful, for example, for fabricating a MOSFET having a gate electrode of length of less than 0.1 μm, and the present method can obviate a short channel effect and a reverse short channel effect. In addition, the present method does not require a thermal treatment process to form LDD regions or an ion implantation process to form source and drain regions because these regions are formed by diffusion of dopant. As a result, the present method simplifies the wafer fabrication processes.

The foregoing embodiments are merely exemplary and are not to be construed as limiting. The present teachings can be readily applied to other types of apparatuses. The description herein is intended to be illustrative, and not to limit the scope of the claims. Many alternatives, modifications, and variations will be apparent to those skilled in the art. This patent covers all methods fairly falling within the scope of the appended claims either literally or under the doctrine of equivalents.

What is claimed is:

1. A method of fabricating a MOSFET comprising:

forming a polysilicon gate electrode on a semiconductor substrate;

forming a first doping layer on an area of the semiconductor substrate, the area including the polysilicon gate electrode;

implanting dopant into the first doping layer by means of a high-tilt angle pocket ion implantation;

forming LDD regions on a surface of the semiconductor substrate at two sides of the polysilicon gate electrode by diffusing the dopant of the first doping layer into the semiconductor substrate;

forming an insulating layer on the first doping layer by diffusing the dopant of the first doping layer into the semiconductor substrate;

forming a spacer by etching the insulating layer and the first doping layer;

forming a second doping layer on the semiconductor substrate and the polysilicon gate electrode with the spacer; and forming a source region and a drain region on a surface of the semiconductor substrate at both sides of the polysilicon gate electrode with the spacer by conducting a thermal treatment process so that the dopant of the second doping layer is diffused into the semiconductor substrate.

2. A method as defined in claim 1, wherein said semiconductor substrate comprises Si, GaAs or silicon-on-insulator.

3. A method as defined in claim 1, wherein the first doping layer comprises silicated glass with dopant.

4. A method as defined in claim 1, wherein the dopant comprises B, $BF_2$, P, As or N.

5. A method as defined in claim 1, wherein the pocket ion implantation is performed with an angle between 5° and 45°.

6. A method as defined in claim 1, wherein the spacer has a thickness between 50 Å and 500 Å.

7. A method as defined in claim 1, wherein the second doping layer comprises a doped oxide layer and the second doping layer is formed by means of a plasma enhanced chemical vapor deposition process.

8. A method as defined in claim 1, wherein the second doping layer has a thickness between 100 Å and 1000 Å.

9. A method as defined in claim 1, wherein the thermal treatment process comprises a rapid thermal process.

10. A method as defined in claim 9, wherein the thermal treatment is performed at temperature between 950° C. and 1150° C. for 3 to 20 seconds.

* * * * *